(12) United States Patent
Gao

(10) Patent No.: US 11,297,741 B2
(45) Date of Patent: Apr. 5, 2022

(54) HIGH RESILIENT DEPLOYMENT BASED COOLING SYSTEM FOR ELECTRONIC RACKS

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 0 days.

(21) Appl. No.: 16/883,454

(22) Filed: May 26, 2020

(65) Prior Publication Data

US 2021/0378149 A1 Dec. 2, 2021

(51) Int. Cl.
*H05K 7/20* (2006.01)

(52) U.S. Cl.
CPC ..... *H05K 7/20818* (2013.01); *H05K 7/20736* (2013.01); *H05K 7/20745* (2013.01); *H05K 7/20827* (2013.01)

(58) Field of Classification Search
None
See application file for complete search history.

(56) References Cited

U.S. PATENT DOCUMENTS

| 8,144,467 B2* | 3/2012 | Campbell | H05K 7/20736 361/699 |
| 9,445,529 B2* | 9/2016 | Chainer | H05K 7/2079 |

* cited by examiner

*Primary Examiner* — Mukundbhai G Patel
(74) *Attorney, Agent, or Firm* — Womble Bond Dickinson (US) LLP

(57) ABSTRACT

A cooling system for an electronic rack of a data center, such as an IT rack or PoD, is disclosed. The system includes a coolant distribution unit (CDU) coupled to a rack manifold of the electronic rack through a fluid cooling loop. The CDU supplies cooling fluid that is distributed to the IT rack or PoD, and receives returning warm/hot fluid from the IT rack or PoD. The system further includes an enhancing cooling unit to receive a first part of a first distributed portion of the cooling fluid and to further cool the first part of the first distributed portion of the cooling fluid to a lower temperature value than the one of the supplied cooling fluid through an enhancing cooling loop. The system further includes a first external cooling unit connected to the CDU through a cooling fluid loop to supply the cooling fluid to the CDU. The system further includes an air cooling unit to receive a second distributed portion of the cooling fluid and to use the second distributed portion of the cooling fluid to cool the airflow for IT rack or PoD. The system is arranged in five portions, and fluids and cooling units are shared among the portions within distributing loops.

20 Claims, 6 Drawing Sheets

HIGH RESILIENT DEPLOYMENT BASED COOLING SYSTEM FOR ELECTRONIC RACKS

FIELD OF THE INVENTION

Embodiments of the present invention relate generally to data center cooling. More particularly, embodiments of the invention relate to a high resilient deployment based cooling system for electronic racks of information technology (IT) components.

BACKGROUND

Cooling is a prominent factor in a computer system and data center design. The number of high performance electronic components such as high performance processors packaged inside servers has steadily increased, thereby increasing the amount of heat generated and dissipated during the ordinary operations of the servers. The reliability of servers used within a data center decreases if the environment in which they operate is permitted to increase in temperature over time. Maintaining a proper thermal environment is critical for normal operations of these servers in data centers, as well as the server performance and lifetime, energy efficiency and cost. It requires more effective and efficient cooling solutions especially in the cases of cooling these high performance servers.

With respect to a high density electronic rack of IT components, liquid cooling has become an important technology for high powered density servers and electronics, such as central processing units (CPUs)/graphics processing units (GPUs)/application specific integrated circuit (ASIC). Such cooling system needs to be able to provide the liquid distribution to those components. For other components or IT equipment, they may continue to be air cooled. This means the rack is hybrid cooled using both air and liquid, and thus, air cooling is still required. This means the system is required to be able to circulate both air and liquid. Accordingly, the cooling system would need to provide cooling/cold fluid to the air cooling equipment.

In general, conventional cooling systems primarily focus or being optimized either on liquid cooling or air cooling. They cannot support different types of configurations or variations of a rack or IT equipment if no any system modification is conducted, and are not cost effective. Moreover, they only target the improvement of energy efficiency on the infrastructure side, but not on the rack or IT side. For example, when the operating temperature is increased, facility side energy efficiency can be improved using those conventional cooling systems. Unfortunately, this does not support a performance and power optimization on the IT and rack side. Therefore, facility and IT hardware performance and energy efficient co-design is critical in modern data centers.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
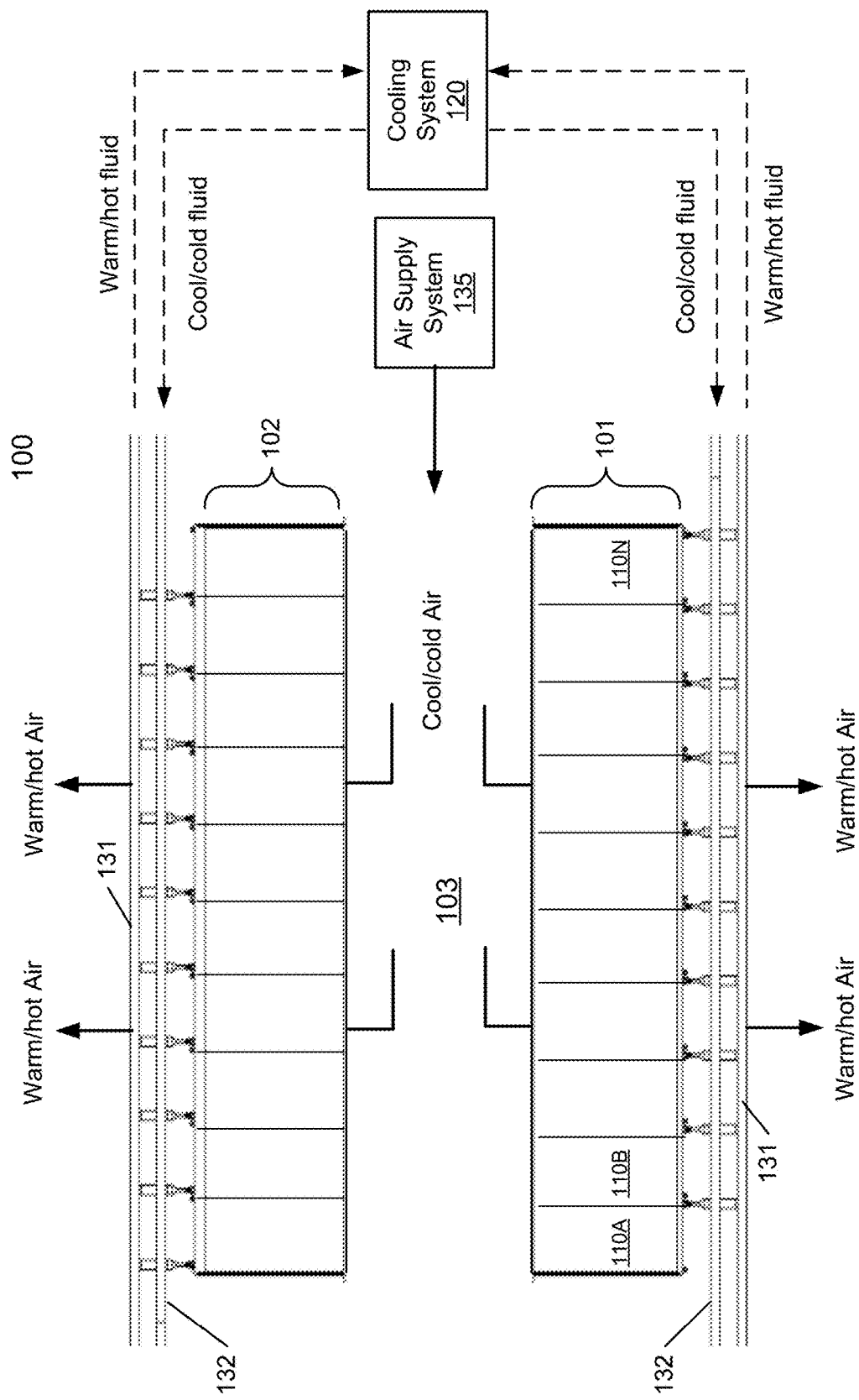
FIG. 1 is a block diagram illustrating an example of a data center facility according to one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

According to some embodiments, a cooling system having an innovative cooling unit is provided for use in a data center with multiple high density racks. The cooling system can be used in next generation cooling architectures for electronic racks of IT components, which as previously discussed, are hybrid cooled by both air cooling and liquid cooling. The cooling system also satisfies the requirements of dynamic configurations of a rack or IT equipment by providing different liquid/fluid cooling and air cooling configurations. Embodiments of the invention provide a resilient solution that is highly required in the modern data center industry and is an important trend. Moreover, embodiments of the invention solve existing problems in conventional cooling systems, such as dynamic rack configurations with hybrid (liquid-air) cooling technology, dynamic variations in power density and IT equipment, flexibility, resilience and other requirements, dynamic variations in operating conditions due to performance considerations. Embodiments of the invention are also enabled to provide large temperature ranges for a liquid cooling loop since for certain electronic components (e.g., CPU, ASIC or GPU), lower temperature may be required for a better energy sufficiency or performance enhancement, while maintaining the entire cooling system at a low total cost of ownership (TCO). Furthermore, embodiments of the invention provide a strong residence for different kind scenarios, for example from a component level to a full system level.

In some embodiments, the cooling system disclosed herein is for use in data center IT equipment. The electronic rack of IT components is hybrid cooled using both cooling water and cooling air. The cooling system provides cooling fluid to either the liquid cooling devices and air cooling devices by using one or more cooling distribution units. An enhancing cooling loop is also utilized in the system for the liquid/fluid cooling loop. It is used for providing enhanced thermal environment for the liquid cooling components when needed. The method can be understood as that designing and operating the system to provide majority of the required enhanced conditions which generally for majority types of IT equipment or clusters. This is to improve system design flexibility and resiliency. The enhancing cooling unit is connected to a refrigeration cycle loop or a similar loop that provides similar functions for a certain period of time. In one embodiment, the enhancing cooling unit can also be embedded into the cooling distribution unit. Also disclosed herein is a system level architecture which includes secondary distribution portion and primary loop portion together with the enhancing cooling portion are utilized between the IT and cooling units.

According to one aspect, a cooling system for an electronic rack of a data center is described. The system includes a coolant distribution unit (CDU) coupled to a rack manifold of the electronic rack through a fluid cooling loop. The CDU supplies cooling fluid that is distributed to the rack manifold, and receives returning warm/hot fluid from the rack manifold. The system further includes an enhancing cooling unit to receive a first part of a first distributed portion of the cooling fluid and to further cool the first part of the first distributed portion of the cooling fluid to a temperature lower than a temperature of the supplied cooling fluid through a refrigeration loop. The system further includes a first external cooling unit connected to the CDU through a cooling fluid loop to supply the cooling fluid to the CDU. The system further includes an air cooling unit to receive a second distributed portion of the cooling fluid and to use the second distributed portion of the cooling fluid to cool the hot exhaust air for electronic racks.

In one embodiment, the system further includes a first three-way valve to receive the supplied cooling fluid and to distribute the supplied cooling fluid into the first distributed portion and the second distributed portion, and a second three-way valve to receive the first distributed portion of the cooling fluid and to deliver the first part of the first distributed portion of the cooling fluid to the enhancing cooling unit and a second part of the first distributed portion of the cooling fluid to the rack manifold on the fluid distribution loop. The enhancing cooling unit may supply the further cooled first part of the first distributed portion of the cooling fluid to the fluid cooling loop. The system may further include a condensing unit connected to the enhancing cooling unit through the refrigeration loop. The enhancing cooling unit and the first and second three-way valves may be included in the CDU. The CDU may further include a heat exchanger that transfers heat between the returning warm/hot fluid and the supplied cooling fluid, and a liquid pump that delivers the supplied cooling fluid into the first three-way valve. The CDU may include a number of inlet and outlet ports coupled to the enhancing cooling unit, the second three-way valve, the heat exchanger, and the enhancing cooling unit.

According to another aspect, a cooling system for an electronic rack of a data center is described. The system includes a number of coolant distribution units (CDUs) coupled to a rack manifold of the electronic rack. The CDUs include a first CDU to supply first cooling fluid that is distributed to the rack manifold, and to receive returning warm/hot fluid from the rack manifold. The first CDU includes an enhancing cooling unit to receive a first part of a first distributed portion of the first cooling fluid and to further cool the first part of the first distributed portion of the first cooling fluid through a refrigeration loop. The CDUs further include a second CDU to supply second cooling fluid that is distributed to the rack manifold through a fluid cooling distributing loop and to receive the returning warm/hot fluid from the rack manifold. The second CDU includes an enhancing cooling unit to receive a first part of a first distributed portion of the second cooling fluid and to further cool the first part of the first distributed portion of the second cooling fluid through a chilled fluid distributing loop. The system further includes an air cooling unit to receive a second distributed portion of the first cooling fluid and a second distributed portion of the second cooling fluid, and to use the second distributed portion of the first cooling fluid and the second distributed portion of the second cooling fluid to cool the electronic rack. In one embodiment, there may be multiple air cooling units receive cooling fluid sources from multiple second distribution portions of the cooling fluid from multiple CDUs.

In one embodiment, the system further includes a first external cooling unit connected to the first CDU through a cooling fluid loop to supply the first cooling fluid to the first CDU. The first external cooling unit is may further be connected to the second CDU through a cooling fluid distributing loop to supply the second cooling fluid to the second CDU. The system may further include a second external cooling unit connected to the enhancing cooling unit of the first CDU through the refrigeration loop. The second external cooling unit may further be connected to the enhancing cooling unit of the second CDU through the chilled fluid distributing loop.

In one embodiment, the first CDU further includes a first three-way valve to receive the supplied first cooling fluid and to distribute the supplied first cooling fluid into the first distributed portion and the second distributed portion of the first cooling fluid. The first CDU may further include a second three-way valve to receive the first distributed portion of the first cooling fluid and to deliver the first part of the first distributed portion of the first cooling fluid to the enhancing cooling unit of the first CDU and a second part of the first distributed portion of the first cooling fluid to the rack manifold through the fluid cooling distribution loop.

In one embodiment, the second CDU further includes a first three-way valve to receive the supplied second cooling fluid and to distribute the supplied second cooling fluid into the first distributed portion and the second distributed portion of the second cooling fluid. The second CDU may further include a second three-way valve to receive the first distributed portion of the second cooling fluid and to deliver the first part of the first distributed portion of the second cooling fluid to the enhancing cooling unit of the second CDU and a second part of the first distributed portion of the second cooling fluid to the rack manifold on the fluid cooling distribution loop.

According to yet another aspect, a data center system is described. The system includes independently deployable portions including a rack portion having (i) an electronic rack containing a number of server chassis and each server chassis corresponding to one or more servers, where the electronic rack includes a rack manifold to receive cooling fluid and to return warm/hot fluid from the electronic rack, and (ii) an air cooling unit to cool the airflow for electronic rack. The system further includes a secondary distribution portion including (i) a fluid cooling distributing loop to deliver the cooling fluid to the electronic rack, (ii) a system return distributing loop to deliver the returning warm/hot fluid from the electronic rack and air cooling unit, and (iii) an air cooling distributing loop to deliver a distributed portion of the cooling fluid to the air cooling unit. The system further includes an enhancing cooling portion including (i) a first coolant distribution unit (CDU) to supply a first portion of the cooling fluid to the rack manifold, to receive a first portion of the warm/hot fluid from the rack manifold, and to supply another distributed portion of the cooling fluid to the air cooling unit through the air cooling distributing loop and receive warm/hot fluid through system return distribution loop, and (ii) a second CDU to supply a second portion of the cooling fluid to the rack manifold through the fluid cooling distributing loop, to receive a second portion of the warm/hot fluid through the system return distributing loop, and to supply the distributed portion of the cooling fluid to the air cooling unit through the air cooling distributing loop and receive warm/hot fluid through system return distribution loop.

FIG. 1 is a block diagram illustrating an example of a data center or data center unit according to one embodiment. In this example, FIG. 1 shows a top view of at least a portion of a data center. Referring to FIG. 1, according to one embodiment, data center system 100 includes one or more rows of electronic racks of IT components, equipment or instruments 101-102, such as, for example, computer servers or computing nodes that provide data services to a variety of clients over a network (e.g., the Internet). In this embodiment, each row includes an array of electronic racks such as electronic racks 110A-110N. However, more or fewer rows of electronic racks may be implemented. Typically, rows 101-102 are aligned in parallel with frontends facing towards each other and backends facing away from each other, forming aisle 103 in between to allow an administrative person walking therein. However, other configurations or arrangements may also be applied. For example, two rows of electronic racks may back to back face each other without forming an aisle in between, while their frontends face away from each other. The backends of the electronic racks may be coupled to the room cooling liquid manifolds. The current method presented in the present disclosure can be implemented on different configurations, including ones not discussed herein.

In one embodiment, each of the electronic racks (e.g., electronic racks 110A-110N) includes a housing to house a number of IT components arranged in a stack operating therein. The electronic racks can include a cooling liquid manifold, a number of server slots (e.g., standard shelves or chassis configured with an identical or similar form factor), and a number of server chassis (also referred to as server blades or server shelves) capable of being inserted into and removed from the server slots. Each server chassis represents a computing node having one or more processors, a memory, and/or a persistent storage device (e.g., hard disk), where a computing node may include one or more servers operating therein. At least one of the processors is attached to a liquid cold plate (also referred to as a cold plate assembly) to receive cooling liquid. In addition, one or more optional cooling fans are associated with the server chassis to provide air cooling to the computing nodes contained therein. Note that the cooling system 120 may be coupled to multiple data center systems such as data center system 100. There may be multiple cooling systems coupled to a data center or a cluster.

In one embodiment, cooling system 120 includes an external liquid loop connected to a cooling tower or a dry cooler external to the building/housing container. The cooling system 120 can include, but is not limited to evaporative cooling, free air, rejection to large thermal mass, and waste heat recovery designs. Cooling system 120 may include or be coupled to a cooling liquid source that provide cooling liquid.

In one embodiment, each server chassis is coupled to the cooling liquid manifold modularly, such that a server chassis can be removed from the electronic rack without affecting the operations of remaining server chassis in the electronic rack and the cooling liquid manifold. In another embodiment, each server chassis is coupled to the cooling liquid manifold through a quick-release coupling assembly having a server liquid intake connector and a server liquid outlet connector coupled to a flexible hose to distribute the cooling liquid to the processors. The server liquid intake connector is to receive cooling liquid via a rack liquid intake connector from a cooling liquid manifold mounted on a backend of the electronic rack. The server liquid outlet connector is to emit warmer or hotter liquid carrying the heat exchanged from the processors to the cooling liquid manifold via a rack liquid outlet connector and then back to a coolant distribution unit (CDU) within the electronic rack.

In one embodiment, the cooling liquid manifold disposed on the backend of each electronic rack is coupled to liquid supply line 132 (also referred to as a room supply manifold) to receive cooling liquid from cooling system 120. The cooling liquid is distributed through a liquid distribution loop attached to a cold plate assembly on which a processor is mounted to remove heat from the processors. A cold plate is configured similar to a heat sink with a liquid distribution tube attached or embedded therein. The resulting warmer or hotter liquid carrying the heat exchanged from the processors is transmitted via liquid return line 131 (also referred to as a room return manifold) back to cooling system 120.

Liquid supply/return lines 131-132 are referred to as data center or room liquid supply/return lines (e.g., global liquid supply/return lines), which supply cooling liquid to all of the electronic racks of rows 101-102. The liquid supply line 132 and liquid return line 131 are coupled to a heat exchanger of a CDU located within each of the electronic racks, forming a primary loop. The secondary loop of the heat exchanger is coupled to each of the server chassis in the electronic rack to deliver the cooling liquid to the cold plates of the processors.

In one embodiment, data center system 100 further includes an optional airflow delivery system 135 to generate an airflow to cause the airflow to travel through the air space of the server chassis of the electronic racks to exchange heat generated by the computing nodes due to operations of the computing nodes (e.g., servers) and to exhaust the airflow exchanged heat to an external environment or a cooling system (e.g., air-to-liquid heat exchanger) to reduce the temperature of the airflow. For example, air supply system 135 generates an airflow of cool/cold air to circulate from aisle 103 through electronic racks 110A-110N to carry away exchanged heat.

The cool airflows enter the electronic racks through their frontends and the warm/hot airflows exit the electronic racks from their backends. The warm/hot air with exchanged heat is exhausted from room/building or cooled using a separate cooling system such as a liquid to air heat exchanger. Thus, the cooling system is a hybrid liquid-air cooling system, where a portion of the heat generated by a processor is removed by cooling liquid via the corresponding cold plate as an example, while the remaining portion of the heat generated by the processor (or other electronics or processing devices) is removed by airflow cooling.

Figure 2:
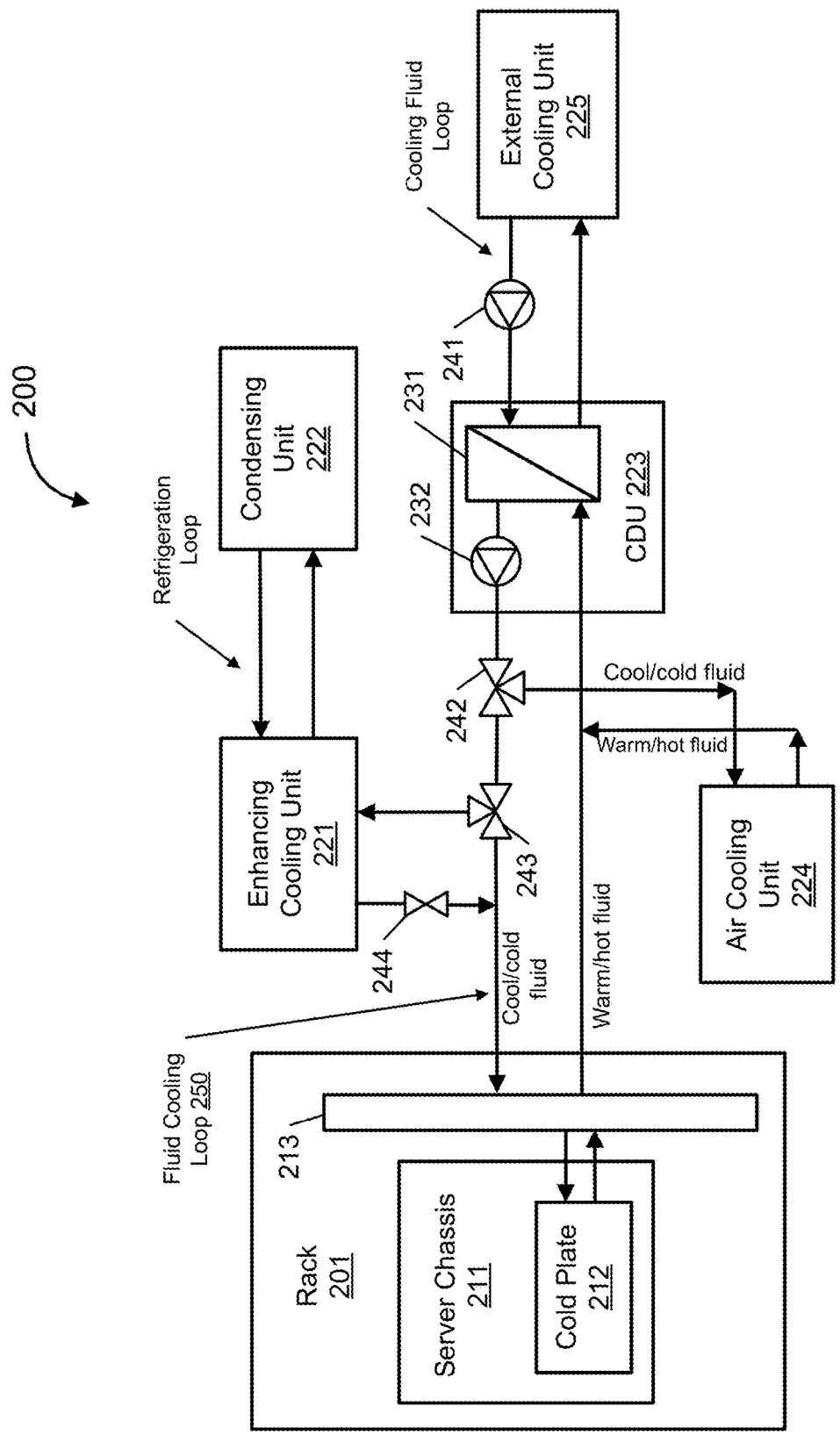
FIG. 2 is a schematic diagram illustrating an example of a cooling system according to one embodiment.

FIG. 2 is a schematic diagram illustrating an example of a cooling system according to one embodiment. Referring to FIG. 2, an electronic rack 201 is coupled to a cooling system 200 to receive cooling liquid/fluid from cooling system 200. Electronic rack 201 may represent any of the electronic racks as shown in FIG. 1, such as, for example, electronic racks 110A-110N. As shown, electronic rack 201 may include a server chassis 211 and a rack (or cooling liquid) manifold 213. Server chassis 211 may include a liquid cold plate 212 (also referred to as a cold plate assembly) coupled to manifold 213 to receive cooling fluid from manifold 213 and return warm/hot fluid to manifold 213. Using the received cooling fluid from manifold 213, cold plate 212 (on which IT components of server chassis 211 are mounted to) can remove heat generated by the IT components.

With continued reference to FIG. 2, cooling system 200 may include, but not limited to, an enhancing cooling unit 221, a condensing unit (or condenser, or external cooling unit) 222, a CDU 223, an air cooling unit 224, and an external cooling unit 225. CDU 223 may supply cooling fluid to rack 201 by supplying the fluid to rack manifold 213 via three-way valves 242-243, with rack manifold 213 delivering the fluid to cold plate 212. CDU 223 may also supply the cooling fluid to air cooling unit 224 (e.g., liquid-to-air heat exchanger) so that the air cooling unit 224 can use the supplied cooling fluid to cool recirculated air for rack 201. For example, in one embodiment, the cooling liquid flows through air cooling unit 224 and exchanges heat with warm/hot air exhaust from rack 201 (e.g., server chassis 211) and circulate into air cooling unit 224. As a result from the heat exchange within the air cooling unit, hot air is cooled and cool/cold air may be generated and supplied to rack 201 in order to cool rack 201, while warm/hot fluid exhausts from air cooling unit 224 to be mixed with warm/hot fluid generated by manifold 213. In one embodiment, air cooling unit 224 can be integrated as part of rack 201. It need to be noted that the cooling airflow is not shown in the figure. Cool air is supplied to rack 201 and then hot exhaust air goes to the air cooling unit 224. The air cooling unit 224 supplies the cooling air back to rack 201.

In some embodiments, three-way valve 242 is configured to distribute different amounts of fluid to rack manifold 213 and air cooling unit 224. That is, valve 242 may be used to adjust the cooling capacity delivery for different cooling portions, such as an air cooling portion and a liquid cooling portion. For example, on the liquid/fluid distribution loop attached or coupled to rack manifold 213, three-way valve 243 is used to direct full or partial cool fluid to enhancing cooling unit 221 (e.g., a liquid-to-liquid heat exchanger). Enhancing cooling unit 221 may be used to enhance the cooling capacity on the liquid distribution loop or the entire cooling loop. Within enhancing cooling unit 221, the cool fluid can further be cooled to a much lower temperature since enhancing cool unit 221 is cooled by a refrigeration loop connected or coupled to condensing unit 222. The cool/cold fluid delivered to enhancing cooling unit 221 from condensing unit 222 may then be supplied back to fluid cooling loop 250, via two-way valve 244, in order to deliver to rack manifold 213 (valve 244 is a good to have unit in the system 200 though it may be optional in some embodiments, it may also provide additional features for enhancing system control). Note that condensing unit 222 can be any kind of condensing unit or (condenser) commercially available or customized ones. Thus, the details of condensing unit 222 will not be described herein. In one embodiment, the cool/cold fluid, as supplied by enhancing cooling unit 221, may be mixed with the cool fluid supplied by CDU 223 on the fluid cooling loop 250, and the fluid mixture is delivered to manifold 213.

In one embodiment, CDU 223 may include a heat exchanger 231 and a liquid pump 232. CDU 223 may also include a pump controller (not shown), and some other components such as a liquid reservoir, a power supply, monitoring sensors and so on. Note that CDU 223 can be any kind of CDUs commercially available or customized ones. Thus, the details of CDUs 223 will not be described herein. Heat exchanger 231 may be connected to an external cooling unit 225 via a cooling fluid loop. Heat exchanger 231 may receive cool fluid from external cooling unit 225 via liquid pump 241. In one embodiment, heat from the warm fluid delivered by manifold 213 (and delivered by air cooling unit 224) may be transferred to the cool fluid, while going through heat exchanger 231, before being extracted to external cooling unit 225. The cool fluid from external cooling unit 225 is passed onto a liquid distribution loop using liquid pump 232. In one embodiment, heat exchanger 231 may be a liquid-to-liquid heat exchanger. In one embodiment, external cooling unit 225 can be a cooling tower (either an open loop or close loop), evaporative cooling coil, a dry cooler, or the like external to the building/housing container.

Note that FIG. 2 only presents a simplified representation of the cooling system 200 and the corresponding key structures where only one of each of the components (e.g., units 221-225) is presented. As previously described, a data center system (e.g., data center system 100) may include multiple rows of electronic racks of IT components. Thus, system 200 can include a multiplicity of each of the units 221-225 for cooling those rows of electronic racks.

Figure 3:
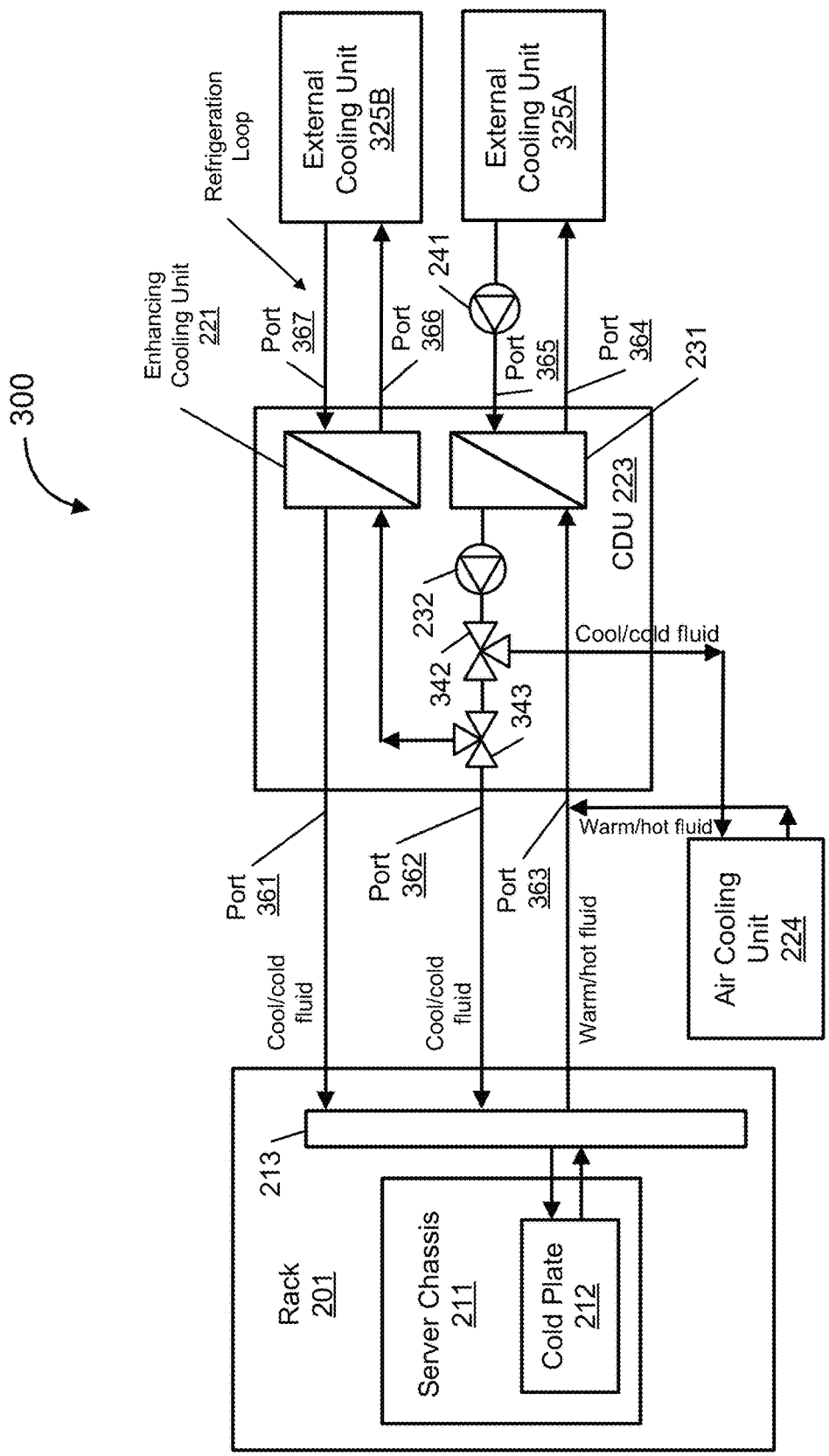
FIG. 3 is a schematic diagram illustrating another example of a cooling system according to one embodiment.

FIG. 3 is a schematic diagram illustrating another example of a cooling system according to one embodiment. In cooling system 300 of FIG. 3, enhancing cooling unit 221 is integrated into CDU 223. Three-way valves 342-343 are also included in CDU 223 and are used to manipulate the fluid. For example, valve 342 is used in a similar fashion as valve 242 by distributing different amounts of fluid to rack manifold 213 and air cooling unit 224. Accordingly, valve 342 can be used to adjust the cooling capacity delivery for different cooling portions, such as an air cooling portion and a liquid cooling portion. Similar to valve 243, three-way valve 343 is used to direct full or partial cool fluid distributed by valve 342 to enhancing cooling unit 221 (as previously described, and thus, will not be described again herein). However, in FIG. 3, CDU 223 includes a number of inlet and outlet ports 361-367. For example, outlet port 361 connects enhancing cooling unit 221 to rack manifold 213, and outlet port 362 connects valve 343 to rack manifold 213. Ports 361-362 may independently supply cool/cold fluid to manifold 213 simultaneously at different or same fluid temperature, though they may provide fluid in an alternate fashion at different or same fluid temperature. In some embodiments, the fluid supplied by ports 361-362 are mixed in manifold 213. In one embodiment, inlet port 363 connects manifold 213 to heat exchanger 231 to receive returning warm/hot fluid from manifold 213 and air cooling unit 224. Outlet port 364 and inlet port 365 connects a cooling loop between heat exchanger 231 and external cooling unit 325A, as previously described in FIG. 2 with respect to heat exchanger 231 and external cooling unit 225). Outlet port 366 and inlet port 367 connects a refrigeration loop between enhancing cooling unit 221 and external cooling unit 325B. In cooling system 300, within enhancing cooling unit 221, the cool fluid can further be cooled to a lower temperature since enhancing cooling unit 221 is cooled by a refrigeration loop connected or coupled to external cooling unit 325B. In some embodiments, external cooling unit 325B can be a condensing unit (e.g., condensing unit 222 of FIG. 2, or any other type of cooling unit). In one embodiment, each of external cooling units 325A-B is the external cooling unit 225 of FIG. 2. Thus, the details of external cooling units 325A-B will not be described again herein.

Figure 4:
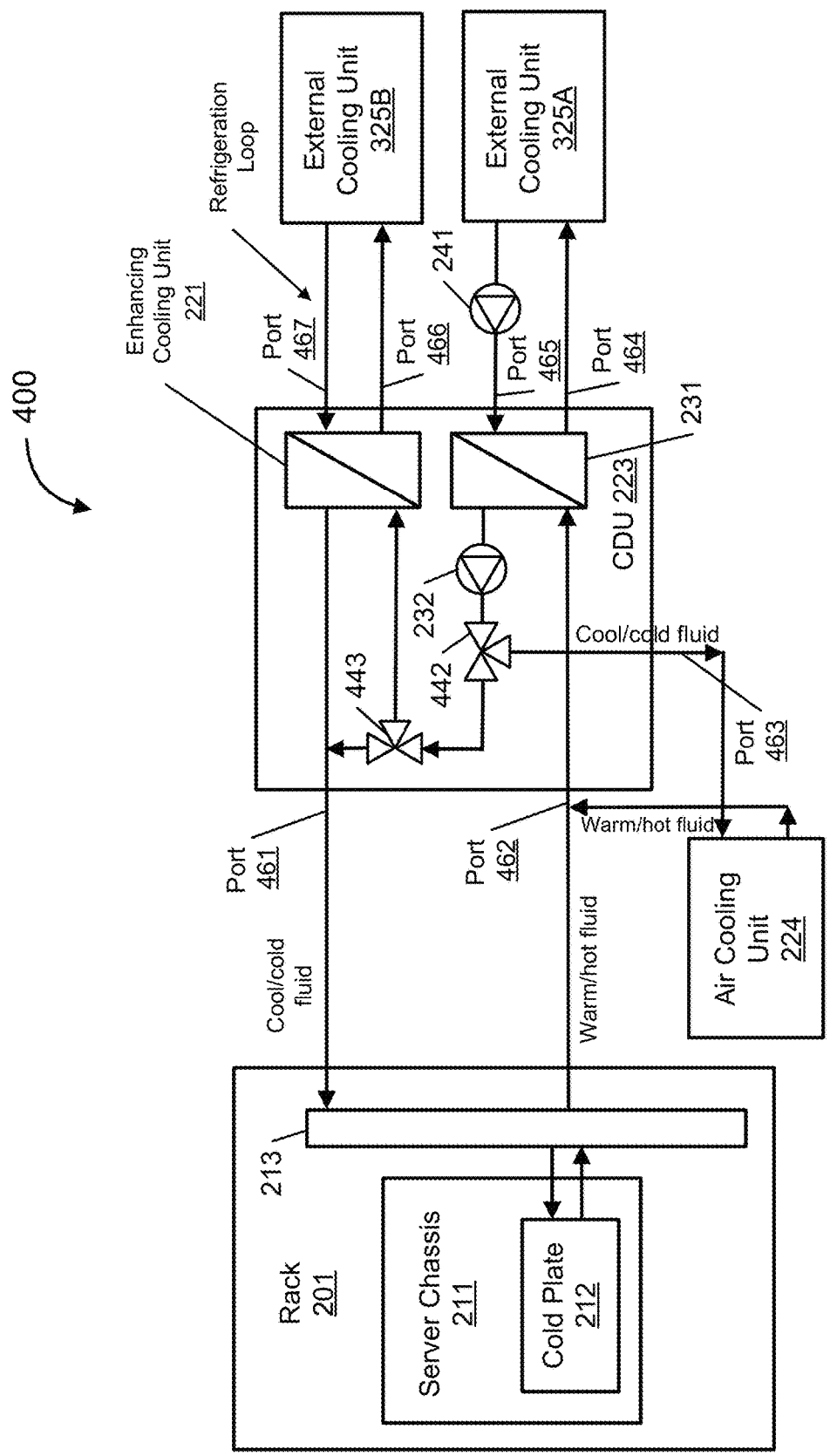
FIG. 4 is a schematic diagram illustrating an example of a cooling system having an alternate coolant distribution unit (CDU) according to one embodiment.

FIG. 4 is a schematic diagram illustrating an example of a cooling system having an alternate cooling distribution unit (CDU) according to one embodiment. In FIG. 4, cooling system 400 is similar to cooling system 300 of FIG. 3. However, ports 361-362 of FIG. 3 are combined in CDU 223 based on an internal design change within the CDU 223. That is, three-way valve 442 may distribute cool/cold fluid to air cooling unit 224 and three-way valve 443 in a similar fashion as valve 342 of FIG. 3. However, in cooling system 400, valve 443 is configured to distribute the fluid back to enhancing cooling unit 221 (similar to valve 343 of FIG. 3) and also back to port 461 (instead of directly to manifold 213). Thus, port 461 may carry a fluid mixture of the fluid supplied by enhancing cooling unit 221 and the fluid supplied by valve 443. Ports 462-467 are configured similarly as ports 362-367 of FIG. 3, and thus, the details of ports 462-467 will not be described again here. In some embodiments, the corresponding design of rack manifold 213 in FIG. 4 is different from the design of rack manifold 213 in FIG. 3. For example, manifold 213 of FIG. 3 may require an additional inlet port to receive cooling fluid the CDU 223.

Figure 5:
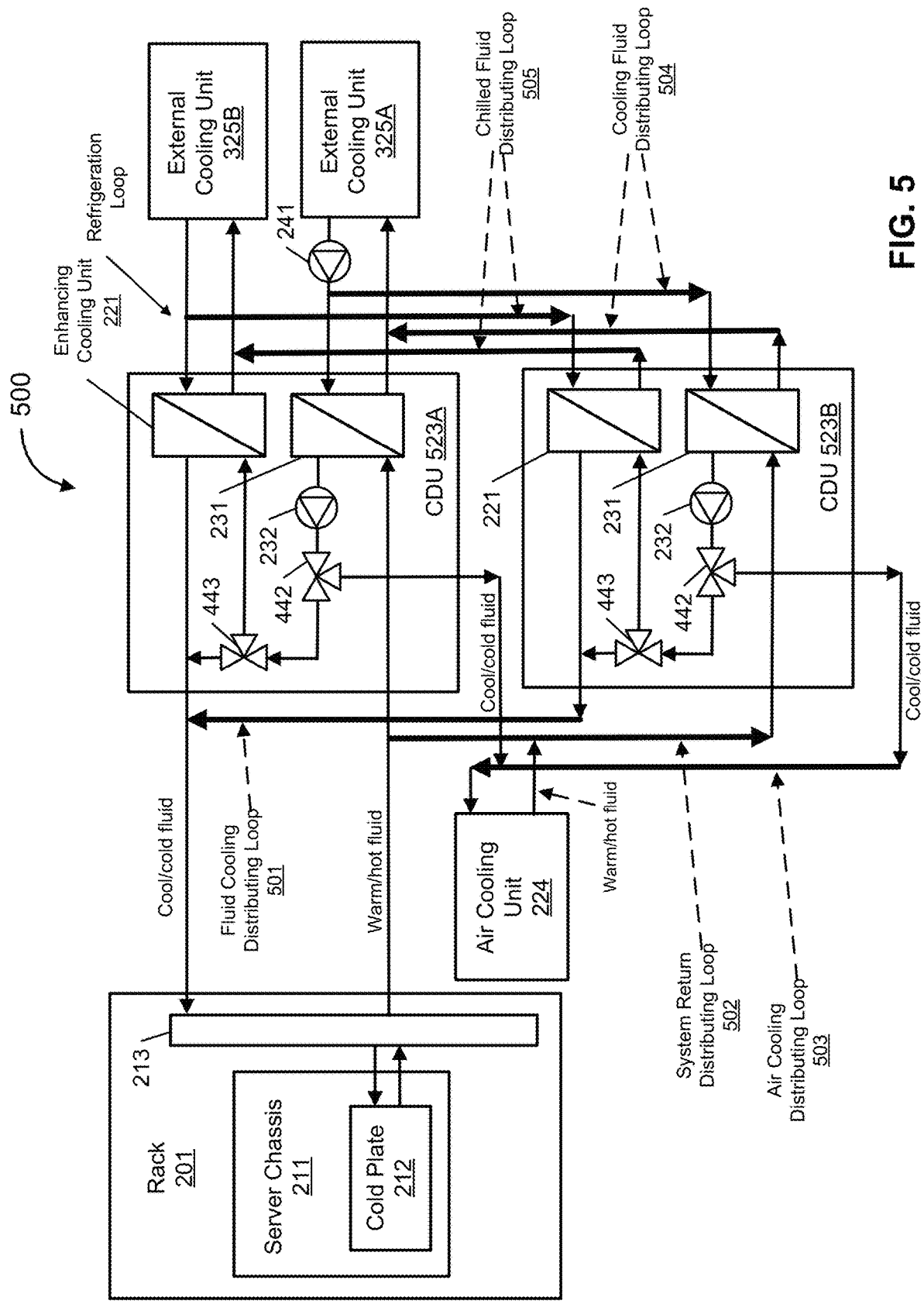
FIG. 5 is a schematic diagram illustrating yet another example of a cooling system according to one embodiment.

FIG. 5 is a schematic diagram illustrating yet another example of a cooling system according to one embodiment. In cooling system 500 of FIG. 5, an air cooling distributing loop 503, a cooling fluid distributing loop 504, and a chilled fluid distributing loop 505 are introduced. This would improve the cooling system design resiliency. In FIG. 5, multiple CDUs 523A-B can be used for distributing fluid to the fluid cooling distributing loop 501. For example, in system 500, a coolant distribution loop may include fluid cooling distributing loop 501, system return distributing loop 502, and air cooling distributing loop 503. Loops 501-503 are used in between electronic rack 201 and CDUs 523A-B. Connecting ports are assembled on these distributing loops, and the cooling units, CDUs and other fluid loops are connected to these distributing loops. Cooling fluid distributing loop 504 and chilled fluid distributing loop 505 are used in between CDUs 523A-B and external cooling units 325A-B. In some embodiments, the fluid used in each of the loops 501-505 may be different from one another, thereby having different temperatures from one another. In other embodiments, however, the fluid used in some or all of the loops 501-505 may be the same fluid. Note that additional control valve or check valve may be used on the distributing loops which are not shown in the figure.

It is noted that in system 500, the CDUs 523A-B and external cooling units 325A-B can be decoupled, and loops 501-505 function as a pool for distributing and receiving fluid. External cooling units 325A-B and CDUs 523A-B can exchange fluid through the pools. Thus, this not only provides flexibility on redundancy design, but also ease of servicing, at the same time, improve infrastructure cost efficiency.

Figure 6:
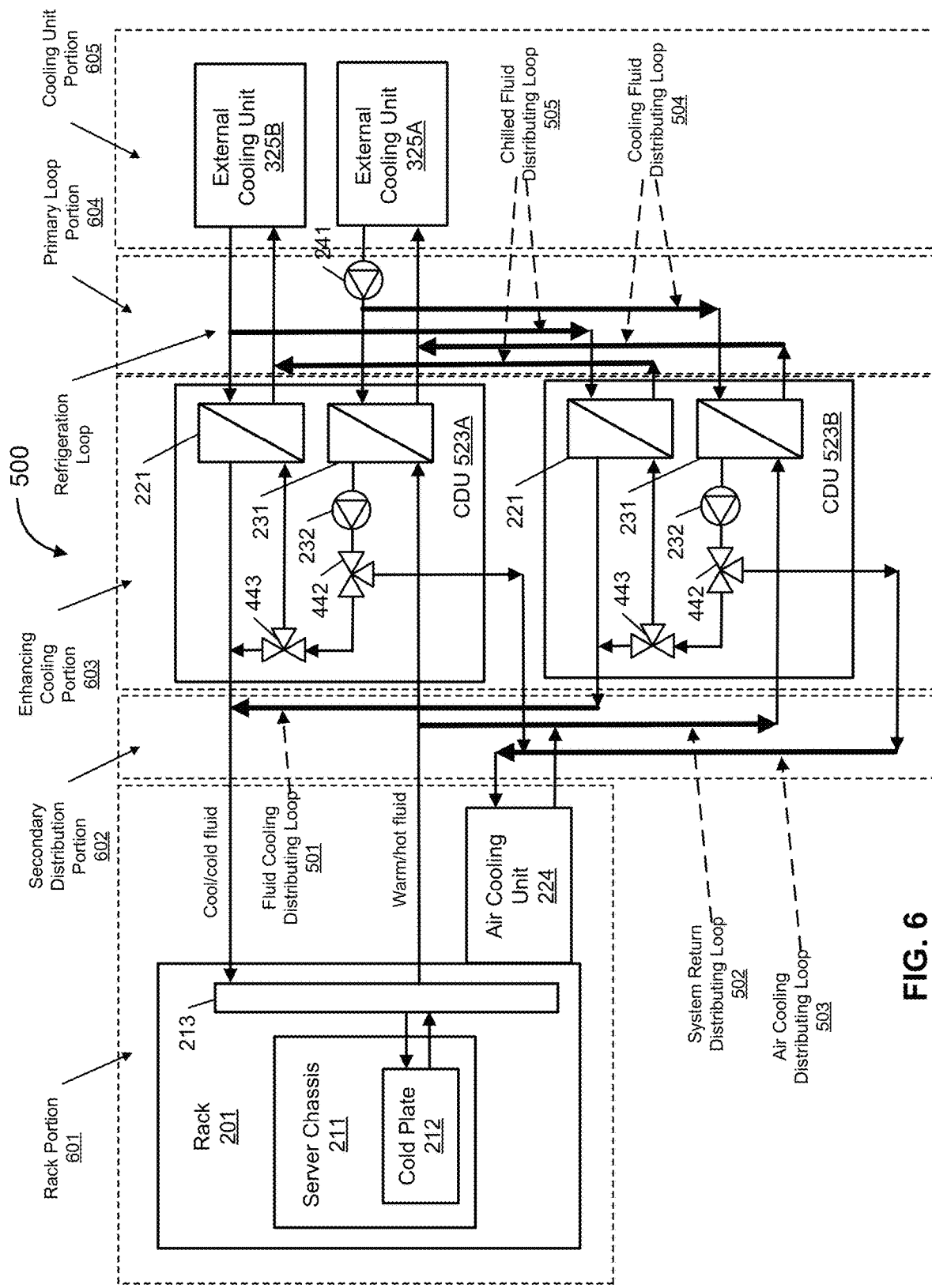
FIG. 6 is a schematic diagram illustrating an example of a cooling system with different data center portions according to one embodiment.

FIG. 6 is a schematic diagram illustrating an example of a cooling system and data center system layout with different portions according to one embodiment. In FIG. 6, system 500 is categorized in five portions, namely rack portion (or IT portion) 601, secondary distribution portion 602, enhancing cooling portion 603, primary loop portion 604, and cooling unit portion 605. This provides a boundary of different sections or modules in system 500. Such categorization of portions (or sections/modules) would simplify the system design and deployment procedures of system 500, as portions 601-605 can be designed and deployed separately and independently, thereby increasing efficiency. This is also important for developing system standardizations, since only the capacity, or connecting methods and certain key parameters or specifications are needed for the modules to be able to connect to a full system and function properly. In addition, this would significantly improve the reliability since the majority of the functions are moving components are packed within a CDU (e.g., CDUs 523A-B). The CDU can be easily replaced and serviced in system 500 without causing major interruption on the system's continuous operation. With primary loop portion 604, the external cooling unit 325B can be used to provide enhancing cooling capacity to server chassis 211 in either CDU 523A or CDU 523B or both. Similar functionalities are provided by portion 602 for different other cooling units in the cooling loops.

In some embodiments, secondary distribution portion 602 and primary loop portion 604 function as a resourcing pool, thereby improving the system resiliency. As an example, the refrigeration loop (between a CDU and an external cooling unit) may be used for different enhancing loops in enhancing cooling portion 603 in a multiple CDUs configuration. Valves (e.g., three-way valves 442-443) may be used on distribution portion 602 and primary loop portion 604 for controlling the fluid. FIG. 6 also provides a concept of a compact and highly efficient method for designing a cooling system for a hybrid (liquid-air) cooling rack. For example, the rack portion 601 can be considered as a point of delivery (PoD). Thus, system 500 can be used for a compute PoD, a storage PoD, or a heterogeneous high performance computing PoD, and a universal enhancing cooling portion (e.g., enhancing cooling portion 603) can be used, either dedicating for a single PoD or multiple PoDs.

The deployment of each portions can be independent from each other. This means that even the corresponding design and specifications of each portion may be supplied by different vendor sources, it may be integrated together and function properly.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:
1. A cooling system for an electronic rack of a data center, comprising:
    a coolant distribution unit (CDU) coupled to a rack manifold of the electronic rack through a fluid cooling loop, the CDU to supply cooling fluid that is distributed to the rack manifold, and to receive returning warm/hot fluid from the rack manifold;
    an enhancing cooling unit to receive a first part of a first distributed portion of the cooling fluid by using a first three-way valve, and to further cool the first part of the first distributed portion of the cooling fluid to a temperature lower than a temperature of the supplied cooling fluid through a refrigeration loop;
    a first external cooling unit connected to the CDU through a cooling fluid loop to supply the cooling fluid to the CDU; and
    an air cooling unit to receive a second distributed portion of the cooling fluid and to use the second distributed portion of the cooling fluid to cool the electronic rack.

2. The cooling system of claim 1, further comprising:
the first three-way valve to receive the supplied cooling fluid and to distribute the supplied cooling fluid into the first distributed portion and the second distributed portion; and
a second three-way valve to receive the first distributed portion of the cooling fluid and to deliver the first part of the first distributed portion of the cooling fluid to the enhancing cooling unit and a second part of the first distributed portion of the cooling fluid to the rack manifold through the fluid cooling loop.

3. The cooling system of claim 2, wherein the enhancing cooling unit supplies the further cooled first part of the first distributed portion of the cooling fluid to the fluid distribution loop.

4. The cooling system of claim 2, further comprising a condensing unit connected to the enhancing cooling unit through the refrigeration loop.

5. The cooling system of claim 2, wherein the enhancing cooling unit and the first and second three-way valves are included in the CDU.

6. The cooling system of claim 5, wherein the CDU further includes a heat exchanger that exchanges heat between the returning warm/hot fluid and the supplied cooling fluid, and a liquid pump that delivers the supplied cooling fluid into the first three-way valve.

7. The cooling system of claim 6, wherein the CDU includes a plurality of inlet and outlet ports coupled to the enhancing cooling unit, the second three-way valve, the heat exchanger, and the enhancing cooling unit.

8. The cooling system of claim 7, wherein the plurality of inlet and outlet ports comprises:
a first outlet port connecting the enhancing cooling unit to the rack manifold,
a second outlet port connecting the second three-way valve to the rack manifold,
a first inlet port connecting the rack manifold to the heat exchanger,
a third outlet port and a second inlet port connecting the cooling fluid loop between the heat exchanger and the first external cooling unit, and
a fourth outlet port and a third inlet port connecting the refrigeration loop between the enhancing cooling unit and a second external cooling unit.

9. The cooling system of claim 7, wherein the plurality of inlet and outlet ports comprises:
a first outlet port connecting the enhancing cooling unit and the second three-way valve to the rack manifold,
a first inlet port connecting the rack manifold to the heat exchanger,
a second outlet port and a second inlet port connecting the cooling fluid loop between the heat exchanger and the first external cooling unit, and
a third outlet port and a third inlet port connecting the refrigeration loop between the enhancing cooling unit and a second external cooling unit.

10. A cooling system for an electronic rack of a data center, comprising:
a plurality of coolant distribution units (CDUs) coupled to a rack manifold of the electronic rack, the plurality of CDUs comprising:
a first CDU to supply first cooling fluid that is distributed to the rack manifold, and to receive returning warm/hot fluid from the rack manifold, the first CDU including an enhancing cooling unit to receive a first part of a first distributed portion of the first cooling fluid and to further cool the first part of the first distributed portion of the first cooling fluid through a refrigeration loop, and
a second CDU to supply second cooling fluid that is distributed to the rack manifold on a fluid cooling distributing loop, and to receive the returning warm/hot fluid from the rack manifold, the second CDU including an enhancing cooling unit to receive a first part of a first distributed portion of the second cooling fluid and to further cool the first part of the first distributed portion of the second cooling fluid through a chilled fluid distributing loop; and
an air cooling unit to receive a second distributed portion of the first cooling fluid and a second distributed portion of the second cooling fluid, and to use the second distributed portion of the first cooling fluid and the second distributed portion of the second cooling fluid to cool the electronic rack through airflow.

11. The cooling system of claim 10, further comprising a first external cooling unit connected to the first CDU through a cooling fluid loop to supply the first cooling fluid to the first CDU, wherein the first external cooling unit is further connected to the second CDU through a cooling fluid distributing loop to supply the second cooling fluid to the second CDU.

12. The cooling system of claim 11, further comprising a second external cooling unit connected to the enhancing cooling unit of the first CDU through the refrigeration loop, wherein the second external cooling unit is further connected to the enhancing cooling unit of the second CDU through the chilled fluid distributing loop.

13. The cooling system of claim 10, wherein the first CDU further comprises a first three-way valve to receive the supplied first cooling fluid and to distribute the supplied first cooling fluid into the first distributed portion and the second distributed portion of the first cooling fluid.

14. The cooling system of claim 13, wherein the first CDU further comprises a second three-way valve to receive the first distributed portion of the first cooling fluid and to deliver the first part of the first distributed portion of the first cooling fluid to the enhancing cooling unit of the first CDU and a second part of the first distributed portion of the first cooling fluid to the rack manifold.

15. The cooling system of claim 14, wherein the second CDU further comprises a first three-way valve to receive the supplied second cooling fluid and to distribute the supplied second cooling fluid into the first distributed portion and the second distributed portion of the second cooling fluid.

16. The cooling system of claim 15, wherein the second CDU further comprises a second three-way valve to receive the first distributed portion of the second cooling fluid and to deliver the first part of the first distributed portion of the second cooling fluid to the enhancing cooling unit of the second CDU and a second part of the first distributed portion of the second cooling fluid to the rack manifold on the fluid cooling distribution loop.

17. A data center system, comprising:
a plurality of independently deployable portions comprising:
a rack portion comprising (i) an electronic rack containing a plurality of server chassis and each server chassis corresponding to one or more servers, wherein the electronic rack comprises a rack manifold to receive cooling fluid and to return warm/hot fluid from the electronic rack, and (ii) an air cooling unit to cool the electronic rack, a secondary distribution portion comprising (i) a fluid cooling distributing loop to deliver the cooling fluid to the electronic rack, (ii) a system return distributing loop to deliver the returning warm/hot fluid from the electronic rack, and (iii) an air cooling distributing loop to deliver a distributed portion of the cooling fluid to the air cooling unit, and an enhancing cooling portion comprising (i) a first coolant distribution unit (CDU) to supply a first portion of the cooling fluid to the rack manifold, to receive a first portion of the warm/hot fluid from the rack manifold, and to supply another distributed portion of the cooling fluid to the air cooling unit through the air cooling distributing loop, and (ii) a second CDU to supply a second portion of the cooling fluid to the rack manifold through the fluid cooling distributing loop, to receive a second portion of the warm/hot fluid through the system return distributing loop, and to supply the distributed portion of the cooling fluid to the air cooling unit through the air cooling distributing loop.

18. The data center system of claim 17, wherein the plurality of independently deployable portions further comprises:
a primary loop portion comprising (i) a cooling fluid distributing loop that connects the second CDU to a first external cooling unit, and (ii) a chilled fluid distributing loop that connects the second CDU to a second external cooling unit,
wherein the first external cooling unit supplies first cooling fluid to the first CDU and second cooling fluid to the second CDU, and the second external cooling unit supplies first chilled fluid having a lower temperature than the first cooling fluid to the first CDU and second chilled fluid having a lower temperature than the second cooling fluid to the second CDU.

19. The data center system of claim 18, wherein the plurality of independently deployable portions further comprises a cooling unit portion comprising the first external cooling unit and the second external cooling unit.

20. The data center system of claim 17, wherein the rack portion is a point of delivery (PoD).

* * * * *